(12) United States Patent
Nelson et al.

(10) Patent No.: US 6,712,110 B1
(45) Date of Patent: Mar. 30, 2004

(54) APPARATUS FOR ATTACHING RESISTS AND WAFERS TO SUBSTRATES

(75) Inventors: William John Nelson, Danville, CA (US); Stanley Lai, Taipei (TW); Larry Shen, Taipei (TW); Jack Lin, Taipei (TW); Shyan-I Wu, Taipei (TW)

(73) Assignee: General Semiconductor of Taiwan, Ltd., Taipei (TW)

( * ) Notice: Subject to any disclaimer, the term of this patent is extended or adjusted under 35 U.S.C. 154(b) by 0 days.

(21) Appl. No.: 10/110,495

(22) PCT Filed: Oct. 12, 2000

(86) PCT No.: PCT/IB00/01542

§ 371 (c)(1),
(2), (4) Date: Sep. 23, 2002

(87) PCT Pub. No.: WO01/29884

PCT Pub. Date: Apr. 26, 2001

(30) Foreign Application Priority Data

Oct. 12, 1999 (TW) .......................................... 88217279

(51) Int. Cl.[7] .............................................. B32B 31/00
(52) U.S. Cl. ....................... 156/499; 156/556; 156/578; 156/580
(58) Field of Search ................................ 156/499, 538, 156/539, 556, 578, 580, 583.1

(56) References Cited

U.S. PATENT DOCUMENTS 5,410,690 A * 4/1995 Kawata ................... 707/104.1
6,085,396 A * 7/2000 Huang ........................ 29/25.42
6,190,947 B1 * 2/2001 Tai et al. ..................... 438/133
6,620,735 B2 * 9/2003 Pinter et al. ................. 438/706

* cited by examiner

Primary Examiner—James Sells
(74) Attorney, Agent, or Firm—Mayer Fortkort & Williams, PC; Stuart H. Mayer, Esq.

(57) ABSTRACT

This invention is related to an apparatus for attaching resists and wafers to substrates, including: first and a second moving devices for moving substrates and wafers respectively; a first tank for containing an adhesive agent; a dispensing device which dispenses a predetermined amount of the adhesive agent at the central region of the wafer; a third moving device for placing the substrate on the wafer, a compressing device which compresses the substrate to squeeze out any possible air bubble existing within the adhesive agent between the substrate and the wafer; a second tank for containing the adhesive agent; a fourth moving device for moving the attached substrate and the wafer together to the second tank such that the complete area of the wafer at the side thereof opposite to the substrate is covered with the adhesive agent in an appropriate amount; a mold having a plurality of cavities arranged in a required pattern; a supplying device for providing a plurality of resists on the mold; a shake-and-load device which shakes the mold such that the resists may be positioned into the cavities thereof; an adherent tape for adhering the resists which are arranged in accordance with the pattern of the mold; the fourth moving device to move the substrate and the wafer together onto the resists and the adherent tape such that the resists are attached with the wafer by the adhesive agent thereon; and a wrapping device for moving the adherent tape and separating the adherent tape from the resists.

11 Claims, 7 Drawing Sheets

APPARATUS FOR ATTACHING RESISTS AND WAFERS TO SUBSTRATES

FIELD OF INVENTION

This invention is related to an apparatus for attaching resists and wafers to substrates which is mainly utilized for attaching a plurality of resists onto a surface of a wafer prior to a subsequent sand blasting operation. More particularly, the invention is utilized in the processes of producing circular semiconductor dice, nevertheless, it can be used in other technical fields in which attachment of different kinds of resists is required. The invention applies wax for adhering a wafer to a glass substrate as well as adhering a plurality of resists made of metal or plastic to the wafer. Sand blasting, resolution, separation and drying processes may be further conducted so as to form a number of individual circular semiconductor dice.

BACKGROUND OF INVENTION

In the manufacture process of semiconductor device, the silicon ingot is generally sliced into flat circular wafers with a diameter of several inches or bigger after completing the growth of silicon crystal. For certain applications, the wafer 10, as illustrated in FIGS. 1 and 2, needs to be further machined so as to form small semiconductor dice for actual utilization.

One of the existing processes of forming small semiconductor dice is to manually adhere a plurality of resists 11 made of metal or plastic onto the wafer 10 as shown in FIG. 2 to cover and protect the areas of the semiconductor dice to be formed. Silicon carbide or other appropriate abrasive media are then used to blast and thus wear away the wafer at the areas without the cover of the resists 11 in order to form a number of individual flat circular semiconductor dice.

The conventional processes of attaching the resists to the wafer are completely conducted by hand and thus, are very inefficient, labor consuming, and can only be achieved by persons with proficient skills. A more detailed description of the conventional processes are substantially illustrated in FIG. 3 including the steps of: melting wax, usually a high-temperature wax, within a tank which can be maintained at a constant temperature; the operators then grip the wafer with tweezers and dip it into the tank so that both sides of the wafer are covered by the wax (step 100); placing the waxed wafer on a glass plate which has been preheated on a hot plate (step 110); the operators shake a tray with a plurality of resists therein and let the resists fall into a mold with a desired pattern, the arranged resists are then adhered onto a tape which is cut into pieces after the adhesion of the resists (step 105); placing the tape with resists thereon over a hot plate with the resists facing upwardly (step 115); placing the combination of the wafer and the glass plate from step 110 over the tape with resists thereon and letting the glass plate at the top (step 120); the operators rub the glass plate with a stick to squeeze out any possible air bubble existed within the wax between the wafer and the glass plate (step 130); and removing the combination of the glass plate, the wafer and the resists from the hot plate and peeling off the tape after the wax is cured (step 140). A sandwich combination as shown in FIG. 2 can thus be formed for subsequent sand blasting operation. The sandwich combination includes, from the top to the bottom, the resists 11, a first layer of wax 12, the wafer 10, a second layer of wax 14 and the glass plate 13.

Although the above technique can achieve the purpose of attaching the resists on the wafer, it still involves various disadvantages. Firstly, the entire operation is manually conducted by operators and therefore requires a lot of labor and the production expense thereof is quite high. Secondly, the conventional processes require proficient skills from the operators to limit the amount of the air bubbles within the wax between the wafer and the glass plate below certain value such that a satisfactory production yield of the final semiconductor dice may be achieved. In particular, the entire dependency on human operators of the conventional processes will result in both the quality and quantity of the products being greatly effected by the emotion, health, or other personal conditions and can hardly remain stable. In addition, the operation of high temperature wax by human operators needs to be improved in consideration of the safety and hygiene situations in the processes. Furthermore, the amount of wax applied by human operation cannot be constantly controlled and an extra amount of wax may be wasted accordingly. In general, the wax will be resolved by acetone in the subsequent processes and thus, if the amount of wax used for attaching the resists is reduced, it will require less amounts of acetone for resolution of wax and thus decrease the environmental pollution induced from the resist attachment operation.

SUMMARY OF INVENTION

It is therefore a primary object of this invention to overcome the above defects of conventional art and to provide an automatic apparatus for attaching resists and wafers to substrates, including: a plurality of substrates; a first magazine receiving the substrates; a first moving device which removes the substrates out of the first magazine; a plurality of wafers, each having a first side and a second side opposite to the first side; a second magazine receiving the wafers; a second moving device which removes the wafers out of the second magazine; a first tank for containing a first adhesive agent; a dispensing device which dispenses a predetermined amount of the first adhesive agent from the first tank to a substantially central region of the first side of each of the wafers; a third moving device which places each of the substrates on the first side of each of the wafers such that the substrate and the wafer are attached by the first adhesive agent to form a substrate-wafer unit; a compressing device which compresses each of the substrates to squeeze out any possible air bubbles existing within the first adhesive agent between each of the substrates and the wafers such that the first adhesive agent applied therebetween is of a uniform thickness; a second tank for containing a second adhesive agent; a fourth moving device which moves the substrate-wafer unit to the second tank such that the second side of each of the wafers is completely coated with the second adhesive agent; a mold having a plurality of cavities which have an amount substantially less than the resists and which are configured to a required pattern; a supplying device which supplies the resists on the mold; a shake-and-load device which shakes the mold such that each of the cavities receives one of the resists; an adherent tape adhering the resists received in the cavities onto the tape to form a resist-tape unit such that the required pattern of the resists is presented on the tape; the fourth moving device which moves the second side of the wafer coated with the second adhesive agent to be attached to the resists thereby the substrate-wafer unit is attached to the resist-tape unit; and a wrapping device which moves the adherent tape to separate the adherent tape from the resists adhered thereonto, thereby forming a plurality of layered sandwich combinations each sequentially including the patterned resists, the second adhesive agent, the wafer, the first adhesive agent, and the substrate.

One of the primary features of this invention resides in that this invention can overcome all the disadvantages induced from the conventional manual operation. Automation of the complete resist attachment process can not only save enormous labor expense and lower the costs of the process, but also significantly improves the efficiency and shortens the required time of the process.

Another feature of this invention resides in that, the automation of the complete process of this invention may further ensure the stability of the product such that the quality and quantity of the resist attachment process can remain consistent and will not be affected by personal emotion or health conditions.

A further advantage of this invention is that the safety and hygiene of the resist attachment process can be improved by avoiding direct contact of the operators with the high temperature wax. Additionally, the apparatus of this invention can decrease the amount of wax needed for attaching the resists and thus reduce the amount of acetone required in the subsequent resolution process and decrease the environmental pollution induced therefrom.

The structures and characteristics of this invention can be realized by referring to the appended drawings and explanations of the preferred embodiments.

BRIEF DESCRIPTIONS OF DRAWINGS

EXPLANATIONS OF PREFERRED EMBODIMENTS

Figure 4:
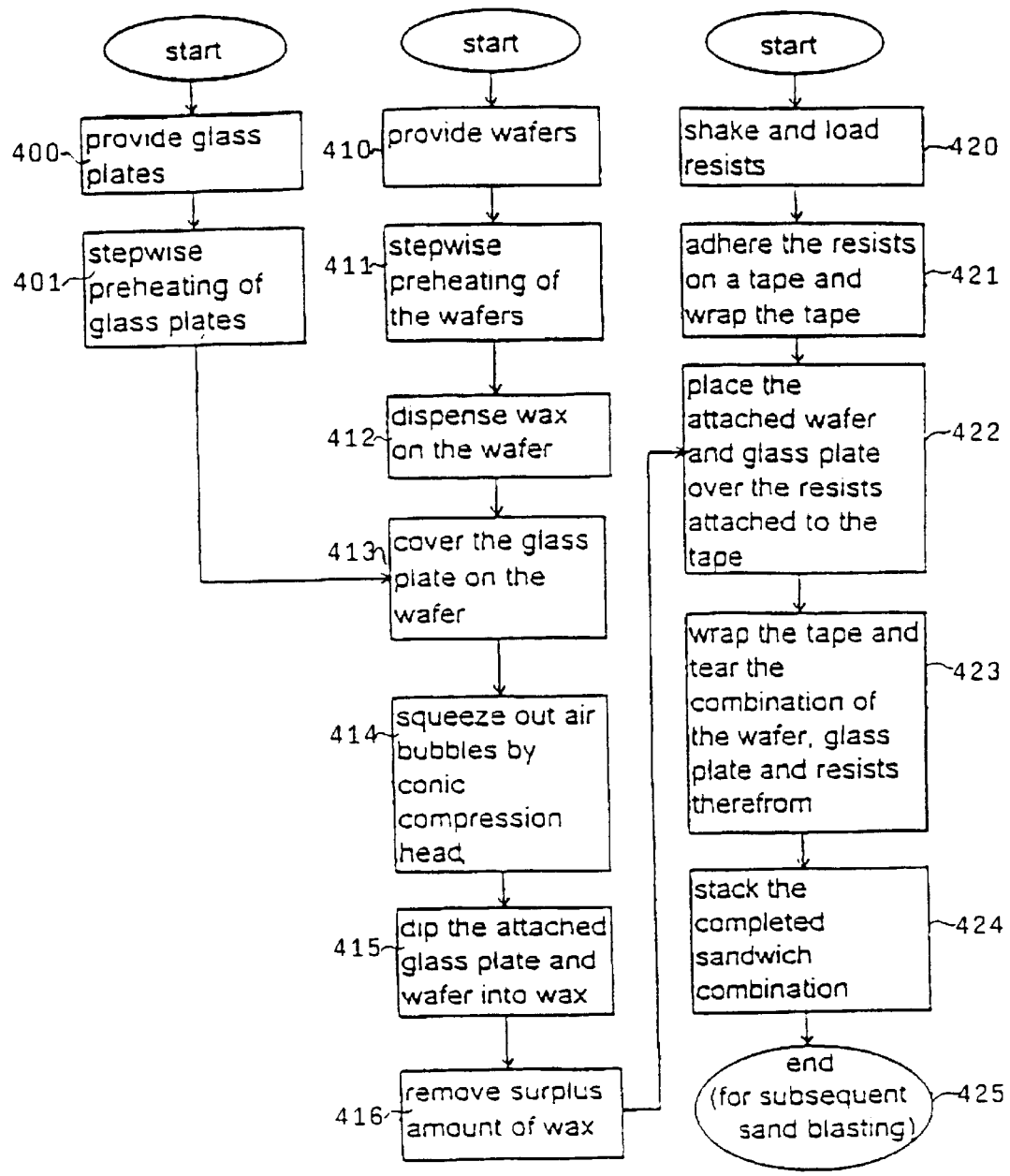
FIG. 4 is a flow chart showing the processes provided by the apparatus of this invention.
Figure 5:
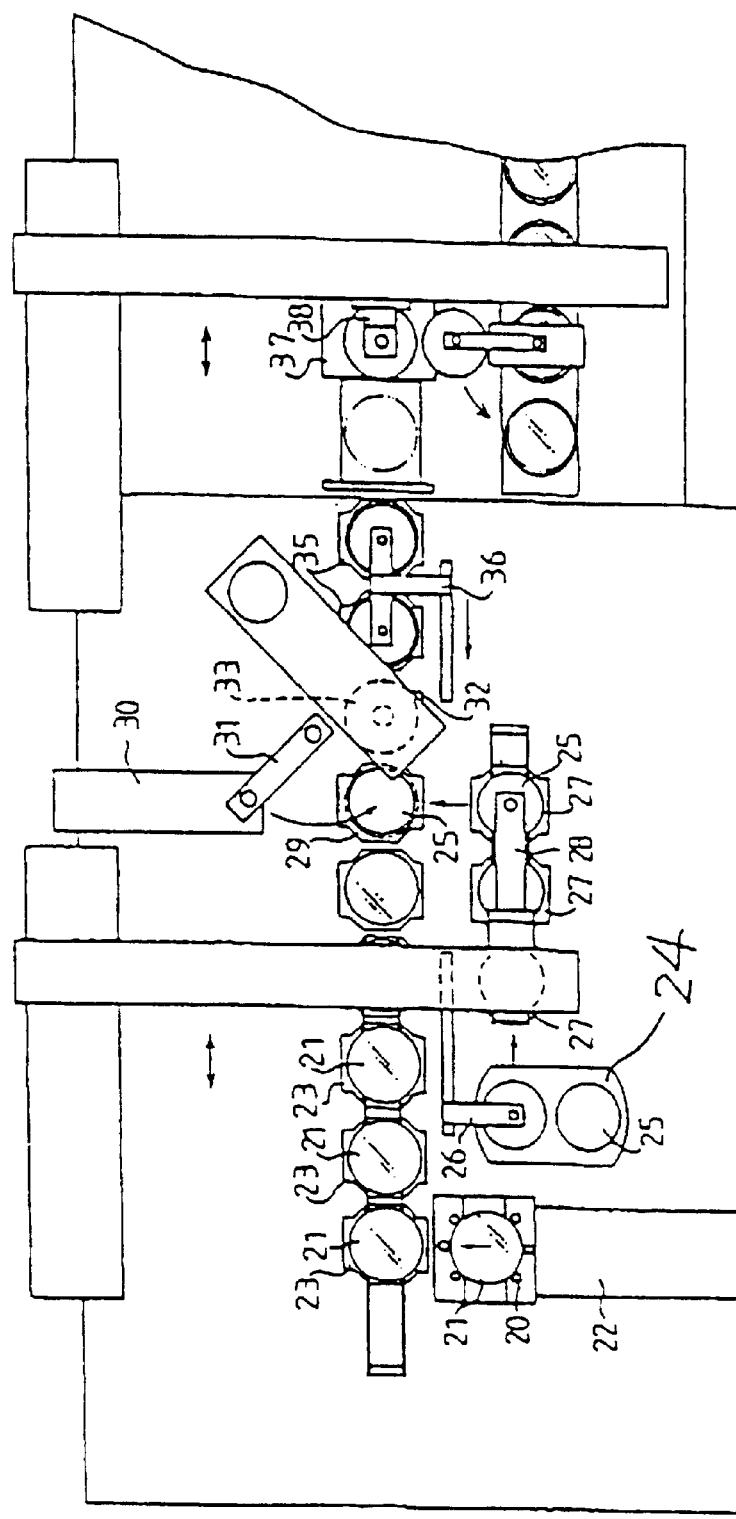
FIG. 5 is a schematic top view showing portions of the major structure of the preferred embodiment of the invention.
Figure 6:
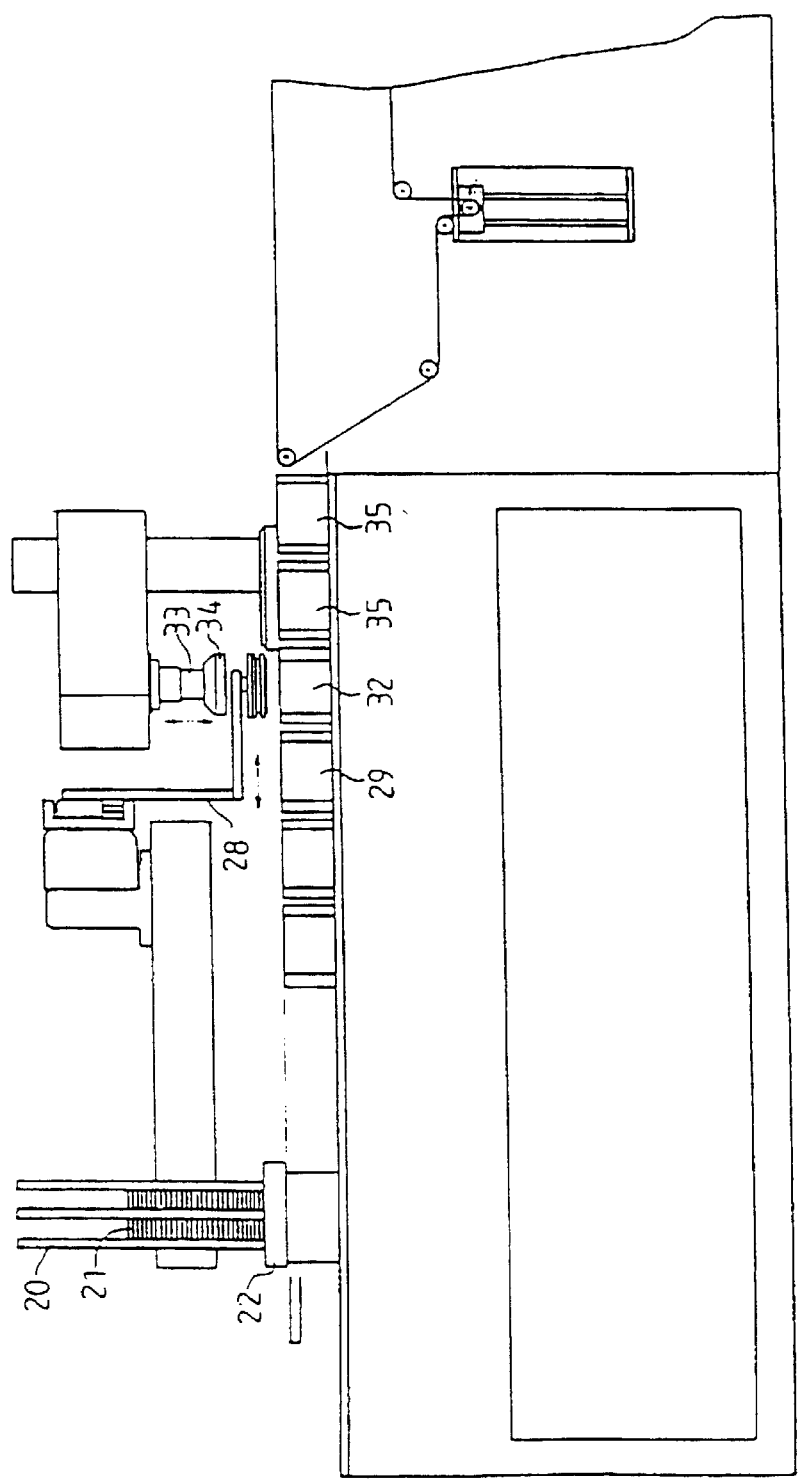
FIG. 6 is a side elevational view of FIG. 5.

This invention is related to an apparatus for attaching resists and wafers to substrates which is mainly utilized in the process of manufacturing semiconductors. The detailed steps provided by the apparatus of the preferred embodiment of this invention are shown in the flow chart of FIG. 4, and the construction of the apparatus of the preferred embodiment is illustrated in FIGS. 5 to 8. According to this invention, the apparatus for attaching resists and wafers to substrates comprises a first magazine 20, as shown in FIGS. 5 and 6, for holding a plurality of substrates. In the preferred embodiment of this invention, the substrates are glass plates 21 being stacked piece by piece within the first magazine 20 (step 400). The glass plate 21 is pushed to a first hot plate 23 for preheating by a first moving device 22 (step 401). The apparatus of this invention also has a second magazine 24 for holding a plurality of wafers 25 which are stacked piece by piece therein (step 410). The wafer 25 is removed and placed on a second hot plate 27 for preheating by a second moving device, such as a machine arm 26 of the preferred embodiment (step 411). The numbers of the first hot plate 23 and the second hot plate 27 may be more than one as shown in FIG. 5. The temperature of each of the hot plates may be set differently as required so that the preheating of the glass plate 21 and the wafer 25 may be stepwise to diminish thermal shock to the glass plate 21 or the wafer 25 and prevent fracture thereof caused by an abrupt temperature change. A sensor (not shown) may be provided for each of the first magazine 20 and the second magazine 24 respectively to generate a warning signal when the level of the glass plates 21 or the wafers 25 within the magazines is below a specified amount. The operators may thereby supplement the glass plates 21 or the wafers 25 into the magazines.

The invention further comprises a third moving device, such as another machine arm 28 in association with vacuum of the preferred embodiment, for moving the preheated wafer 25 onto a wax dispensing station 29. The machine arms 20 and 28 are also used for moving the glass plates 21 and the wafers 25, among different hot plates in sequence. A first tank 30 containing an adhesive agent, for example, a molten wax of the preferred embodiment, is provided while the temperature of the molten wax is controlled by a temperature controller (not shown). An adhesive agent dispensing device, such as the wax dispensing machine 31 as illustrated in FIG. 5, takes a specific amount of molten wax from the first tank 30 and then rotates to the position right above the wax dispensing station 29 and drops the molten wax at substantially the central region of the wafer 25 (step 412). The machine arm 28 is thereafter used to place the glass plate 21 over the wafer 25 so that the glass plate 21 and the wafer 25 are attached together by the wax (step 413). The attached glass plate 21 and wafer 25 are jointly moved to a compression station 32 as shown in FIG. 6. A compressing device 33 with a conic compression head 34 slightly protruded at the center thereof is provided for exerting a pressure on the surface of the glass plate 21 to squeeze out any possible air bubble existed within the wax between the glass plate 21 and the wafer 25 and obtain a uniform thickness of the wax (step 414). The conic compression head 34 is generally made of a resilient plastic material. The slightly protruded central region of the conic compression head 34 of the preferred embodiment involves such a small rate of inclination which is thus not illustrated in the Figures. The primary reason for using a conic shape for the compression head 34 is to allow the glass plate 21 to compress the wafer 25 from the center toward the periphery thereof. Accordingly, any possible air bubble trapped within the wax between the glass plate 21 and the wafer 25 will be squeezed out and a uniform thickness of the wax can be achieved. If the compression head 34 is not in the conic form, the compression head 34 may not be able to force the glass plate 21 compress the wafer 25 from the center thereof outwardly and thus cannot ensure that all the air bubble will be squeezed out. If there are air bubbles trapped within the wax, the attachment between the wafer 25 and the glass plate 21 might be loose so that the wafer above the air bubble will be easily blown away in the subsequent sand blasting process. This will result in loss and waste of the wafer. The glass plate 21, wax and the wafer 25 after compression will be moved to a transition station 35 by another machine arm 36 for cooling and curing of the wax.

Figure 7:
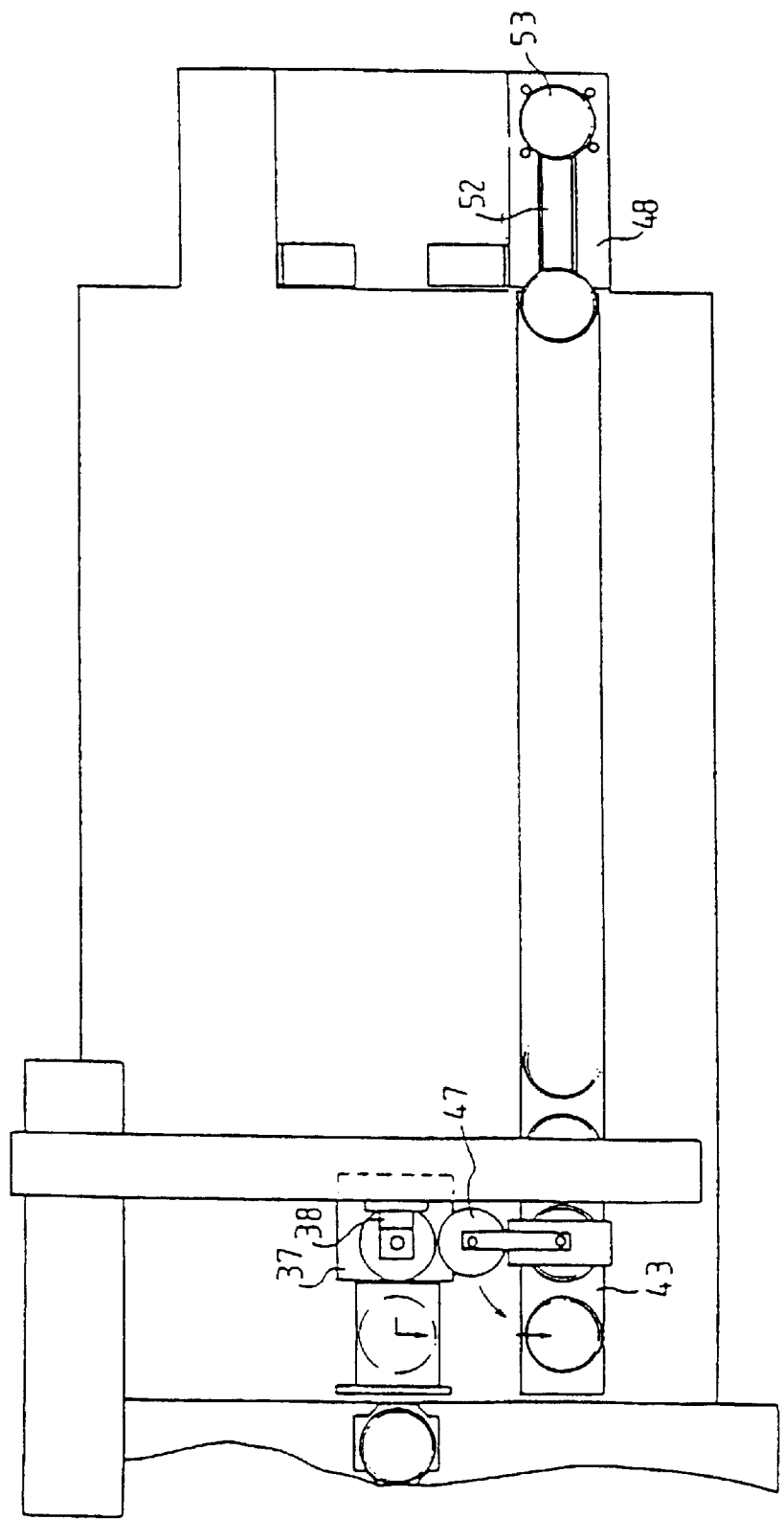
FIG. 7 is a schematic top view showing the other portions of the preferred embodiment of the invention.

A second tank 37 as shown in FIG. 7 is provided for containing the adhesive agent, i.e. the molten wax used in the preferred embodiment. The temperature of the molten wax within the second tank 37 can also be controlled by a temperature controller (not shown). A fourth moving device, such as a set of machine arm 38, is provided to move the attached glass plate 21 and the wafer 25 together to the second tank 37 such that the complete area of the wafer 25 at the side thereof opposite to the glass plate 21 is dipped into the tank 37 and is covered with a layer of the molten wax (step 415) A scraper (not shown) may be mounted on the second tank 37 such that the superfluous amount of the wax on the bottom of the wafer 25 after dipping can be scraped off during, the next movement of the glass plate 21 and the wafer 25 by the machine arm 38.

Figure 1:
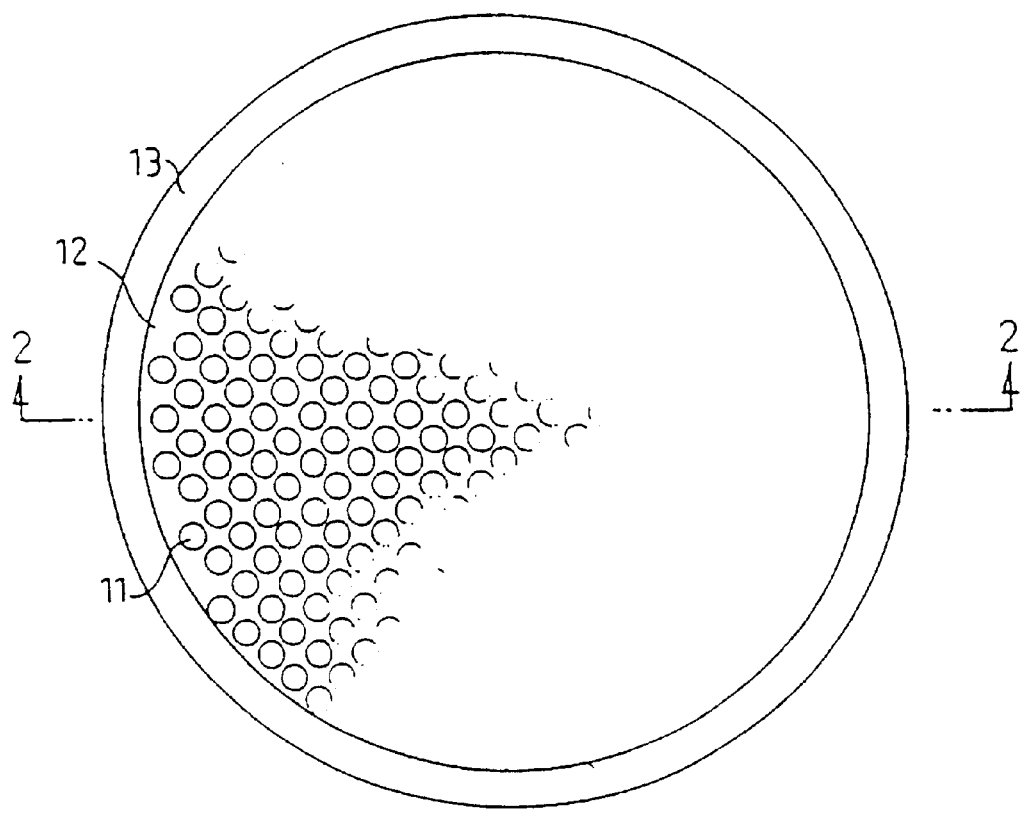
FIG. 1 is a schematic top view of a wafer with resists attached thereon.
Figure 8:
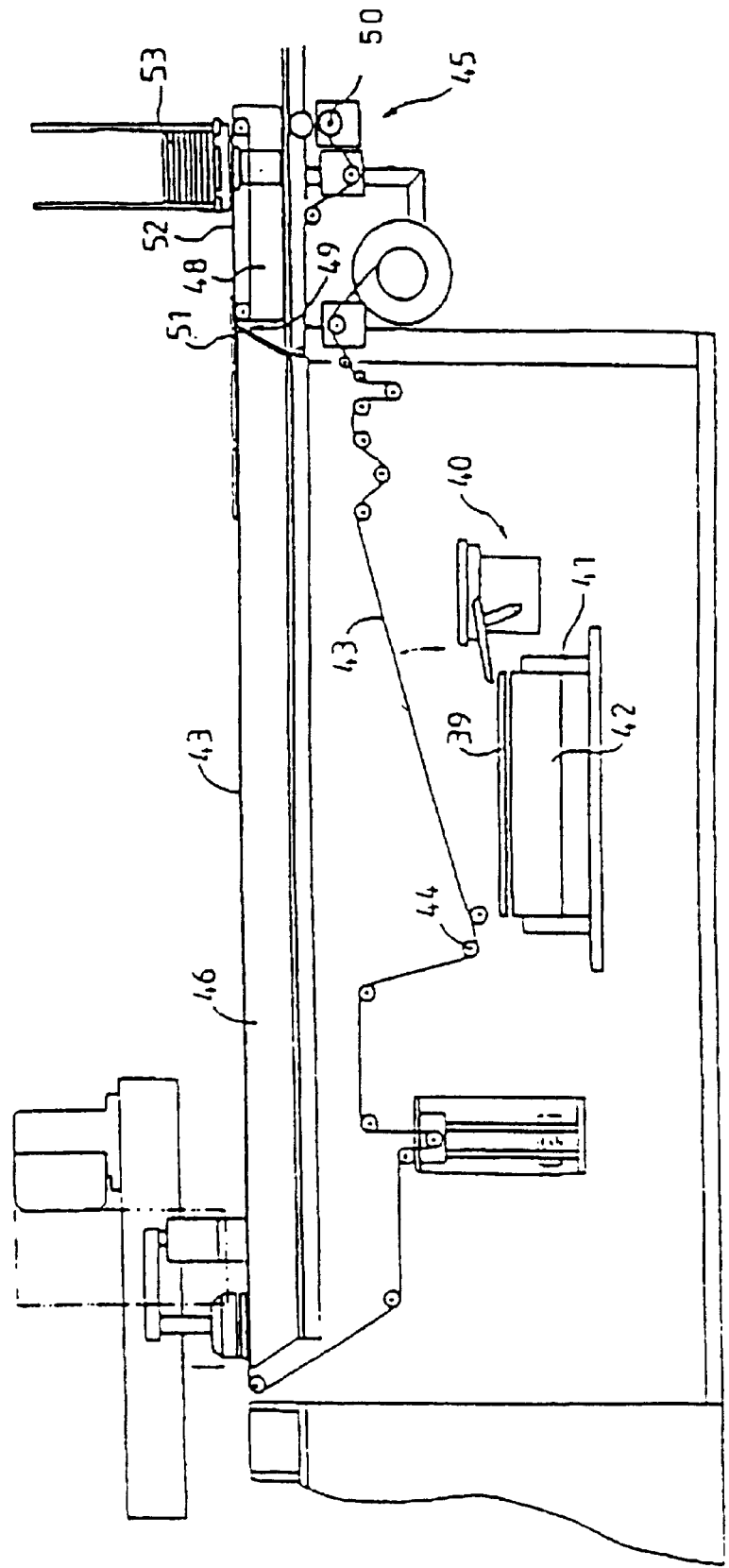
FIG. 8 is a side elevational view of FIG. 7.

The invention further comprises a plate-shaped mold 39 as shown in FIG. 8 with a plurality of cavities (not shown) thereon which are arranged in a required pattern. In the preferred embodiment of the invention, the cavities are round and are arranged as several groups with the pattern being identical to that of the resists as shown in FIG. 1. A supplying device 40 is used to supply a plurality of round resists on the mold 39 wherein the size of the resists is slightly smaller than that of the cavities of the mold 39. A shake-and-load device 41 is then employed to shake the mold 39 such that the resists may fall into each of the cavities of the mold 39 (step 420). After each of the cavities is filled by a resist, the mold 39 will be tilted by the shake-and-load device 41 so that the surplus resists on the mold 39 drop into a collector 42. An adherent tape, such as a tape 43, is then used to adhere the resists which are arranged in accordance with the pattern of the mold 39. The tape 43 may be driven downwardly by a compression device, such as a movable roller 44 of the preferred embodiment, to be in contact with the mold 39 for adhering the resists from the cavities. After completing the adhesion of the resists the roller 44 will return to the original status prior to driving the tape 43 for adhesion of resists. A wrapping device 45 is provided to pull the tape 43 for a certain distance so that the movable roller 44 may repeat the step of downwardly driving the tape 43 to the mold 39 for adhesion of the resists. The tape 43 with resists will continue to be wrapped and moved to a sliding path 46 as shown in FIGS. 7 and 8 (step 421, collectively). The machine arm 38 subsequently moves the dipped wafer 25 and the glass plate 21 together to cover the tape 43 with resists thereon over the sliding path 46 (step 422). When the wafer 25 and the glass plate 21 are placed on the tape 43, the machine arm 38 can perform slight rubbing and compression to ensure no air bubbles trapped within the wax between the wafer 25 and the resists. Another compressing device 47 is used to exert 3 pressure on the glass plate so that the wafer 25 may be firmly adhered with the resists by the wax on the wafer 25.

The tape 43 continues to move horizontally on the sliding path 46 by the wrapping device 45 such that the molten wax may be cured during the period. A platform 48 is provided next to the end of the sliding path 46 and forms a clearance 49 therebetween. The top of the sliding path 46 and the top of the platform 48 are substantially even. The moving direction of the tap 43 changes at an angle greater than 90 degree at the clearance 49 so that the sandwich combination of the resists, a layer of way, the wafer 25, another layer of wax and the glass plate 21 be separated from the tape 43 and moved to the top of the platform 48 (step 423).

Figure 2:
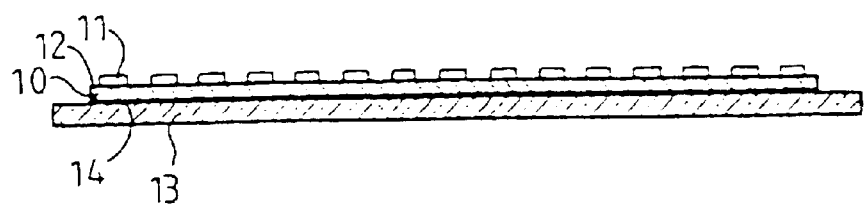
FIG. 2 is a cross-sectional view of FIG. 1.
Figure 3:
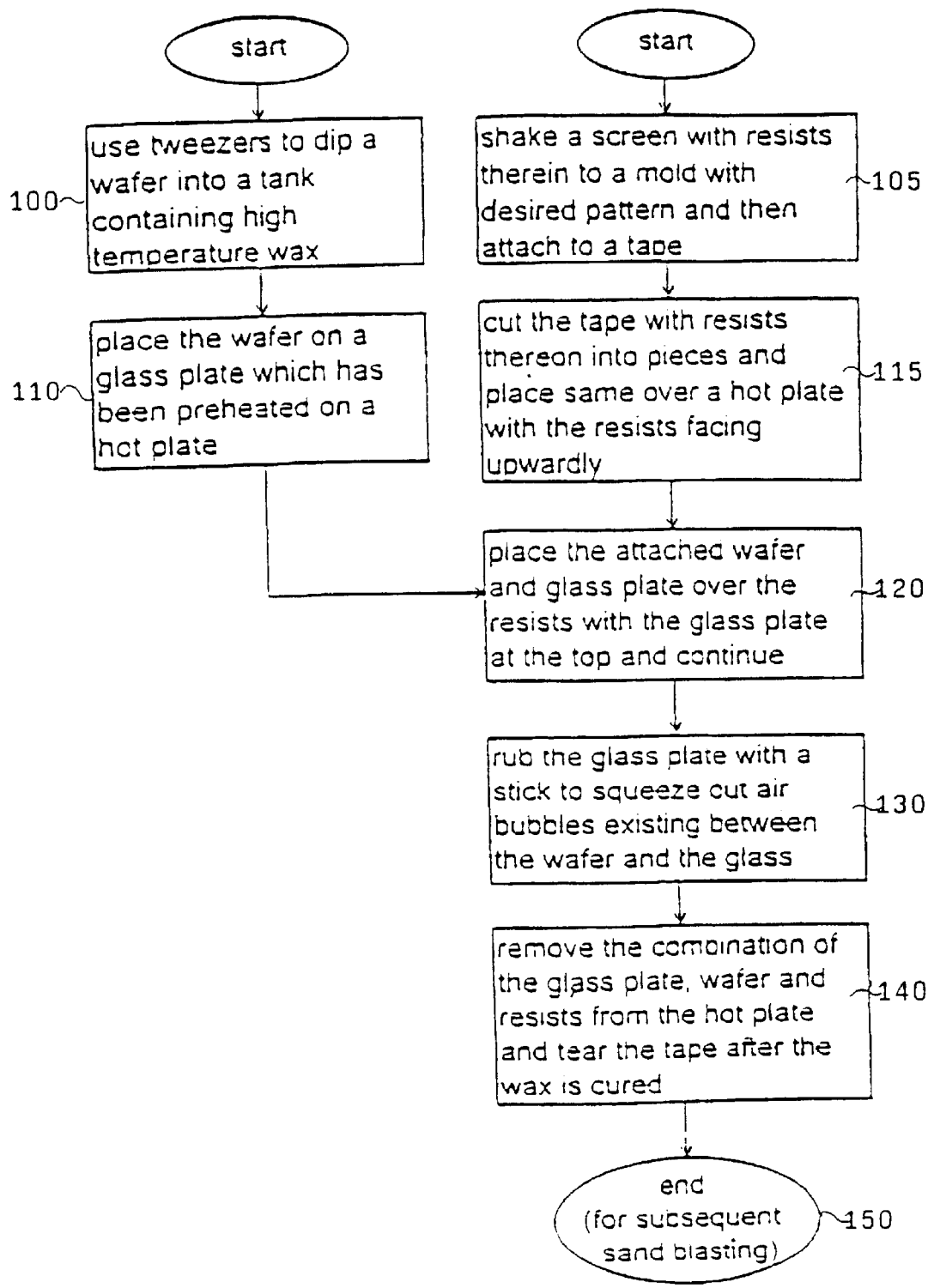
FIG. 3 is a flow chart showing the conventional resist attachment processes.

The tape 43 after use is wrapped on a roller 50 as shown in FIG. 8 and the sandwich combination 51, after completing the attachment of the resists, is moved by a conveyor 52. A sensor and a lifting device (not shown) may be provided around the bottom of the stacked sandwich combination 53. The sensor is used for detecting the approach of the just completed sandwich combination 51 and the lifting device is used to lift the stacked sandwich combination 53 so that the just completed sandwich combination 51 can be moved by the conveyor 52 to the position right under the stacked sandwich combination 53 (step 424). The construction of the sandwich combination 51 from the invention is the same with that shown in FIGS. 1 and 2 and the subsequent sand blasting operation will be performed to form a number of individual circular semiconductor dice (step 425).

This invention is related to a novel device that makes a breakthrough to conventional art. Aforementioned explanations, however, are directed to the description of preferred embodiments according to this invention. Various changes and implementations can be made by those skilled in the art without departing from the technical concept of this invention. Since this invention is not limited to the specific details described in connection with the preferred embodiments, changes to certain features of the preferred embodiments without altering the overall basic function of the invention are contemplated within the scope of the appended claims.

What is claimed is:

1. An apparatus for attaching a plurality of resists and at least one wafer to at least one substrate, comprising:

a plurality of substrates;

a first magazine receiving the substrates;

a first moving device which removes the substrates out of the first magazine;

a plurality of wafers, each having a first side and a second side opposite to the first side;

a second magazine receiving the wafers;

a second moving device which removes the wafers out of the second magazine;

a first tank for containing a first adhesive agent;

a dispensing device which dispenses a predetermined amount of the first adhesive agent from the first tank to a substantially central region of the first side of each of the wafers;

a third moving device which places each of the substrates on the first side of each of the wafers such that the substrate and the wafer are attached by the first adhesive agent to form a substrate-wafer unit;

a compressing device which compresses each of the substrates to squeeze out any possible air bubbles existing within the first adhesive agent between each of the substrates and the wafers such that the first adhesive agent applied therebetween is of a uniform thickness;

a second tank for containing a second adhesive agent;

a fourth moving device which moves the substrate-wafer unit to the second tank such that the second side of each of the wafers is completely coated with the second adhesive agent;

a mold having a plurality of cavities which have an amount substantially less than the resists and which are configured to a required pattern;

a supplying device which supplies the resists on the mold;

a shake-and-load device which shakes the mold such that each of the cavities receives one of the resists;

an adherent tape adhering the resists received in the cavities onto the tape to form a resist-tape unit such that the required pattern of the resists is represented on the tape;

the fourth moving device which moves the second side of the wafer coated with the second adhesive agent to be attached to the resists thereby the substrate-wafer unit is attached to the resist-tape unit; and a wrapping device which moves the adherent tape to separate the adherent tape from the resists adhered thereonto, thereby forming a plurality of layered sandwich combinations each sequentially including the patterned resists, the second adhesive agent, the wafer, the first adhesive agent, and the substrate.

2. The apparatus as set forth in claim 1, wherein the first adhesive agent and the second adhesive agent consist of molten wax.

3. The apparatus as set forth in claim 2, further comprising a temperature controller which is connected with each of the first tank and the second tank to control the temperature of the molten wax.

4. The apparatus as set forth in claim 1, wherein the substrates are glass plates stacked upon one another within the first magazine.

5. The apparatus as set forth in claim 4, further comprising a first hot plate, in which the first moving device moves each of the substrates out of the first magazine to the first hot plate for preheating.

6. The apparatus as set forth in claim 1, wherein the wafers are stacked upon one another within the second magazine.

7. The apparatus as set forth in claim 6, further comprising a second hot plate, in which the second moving device moves each of the wafers out of the second magazine to the second hot plate for preheating.

8. The apparatus as set forth in claim 1, wherein the compressing device includes a compression head slightly protruded substantially at a center thereof.

9. The apparatus as set forth in claim 1, further comprising a compression device which drives the adherent tape to be in contact with the mold for adhering the resists from the cavities of the mold, and then returns to an original position thereof prior to driving the adherent tape for adhesion of resists and wherein the wrapping device pulls the adherent tape a certain distance so that the compression device can repeatedly drive the adherent tape to the mold for adhering the resists.

10. The apparatus as set forth in claim 9, wherein the second adhesive agent is cured when the wrapping device continuously and horizontally moves the adherent tape in a sliding path after the wafer is attached to the resists.

11. The apparatus as set forth in claim 10, further comprising a platform which is provided next to the end of the sliding path to form a clearance therebetween, and wherein the sliding path and the platform are flush with each other, and the adherent tape moves in a direction changing greater than 90 degree at the clearance so that each of the sandwich combinations are separated from the adherent tape and moved onto the platform.

* * * * *

UNITED STATES PATENT AND TRADEMARK OFFICE
CERTIFICATE OF CORRECTION

PATENT NO. : 6,712,110 B1
APPLICATION NO. : 10/110495
DATED : March 30, 2004
INVENTOR(S) : William John Nelson et al.

It is certified that error appears in the above-identified patent and that said Letters Patent is hereby corrected as shown below:

Col. 5, line 10, after "during", delete ",".

Col. 5, line 48, first word, change "3" to --a--, and after "plate", add --21--.

Col. 5, line 56, after "the", change "tap" to --tape--.

Col. 5, line 57, first word, change "degree" to --degrees--.

Col. 5, line 58, after "of", second occurrence, change "way" to --wax--.

Col. 8, line 23, Claim 11, change "degree" to --degrees--.

Signed and Sealed this

Twenty-ninth Day of May, 2007

JON W. DUDAS
*Director of the United States Patent and Trademark Office*